US012787844B2

(12) United States Patent
Tsai et al.

(10) Patent No.: US 12,787,844 B2
(45) **Date of Patent: *Nov. 3, 2026**

(54) METHOD OF FABRICATING SEMICONDUCTOR DEVICE HAVING DUMMY MICRO BUMPS BETWEEN STACKING DIES

(71) Applicant: Taiwan Semiconductor Manufacturing Company, Ltd., Hsinchu (TW)

(72) Inventors: Tsung-Fu Tsai, Changhua County (TW); Chen-Hsuan Tsai, Taitung City (TW); Chung-Chieh Ting, Hsinchu (TW); Shih-Ting Lin, Taipei City (TW); Szu-Wei Lu, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 263 days.

This patent is subject to a terminal disclaimer.

(21) Appl. No.: 18/668,658

(22) Filed: May 20, 2024

(65) Prior Publication Data

US 2024/0304466 A1 Sep. 12, 2024

Related U.S. Application Data

(60) Continuation of application No. 17/407,367, filed on Aug. 20, 2021, now Pat. No. 12,020,952, which is a (Continued)

(51) Int. Cl.

*H10W 74/01* (2026.01)
*H10W 20/20* (2026.01)

(Continued)

(52) U.S. Cl.

CPC ......... *H10W 74/012* (2026.01); *H10W 20/20* (2026.01); *H10W 72/072* (2026.01);

(Continued)

(58) Field of Classification Search

CPC . H10W 74/012; H10W 74/15; H10W 72/851; H10W 72/072; H10W 72/90; H10W 72/20

See application file for complete search history.

(56) References Cited

U.S. PATENT DOCUMENTS

| | | | | |
|---|---|---|---|---|
| 8,472,190 B2 * | 6/2013 | Refai-Ahmed | ....... | H10W 90/00 361/704 |
| 8,704,353 B2 * | 4/2014 | Su | ......................... | H10W 20/40 438/618 |

(Continued)

*Primary Examiner* — Nathan W Ha

(74) *Attorney, Agent, or Firm* — McClure, Qualey & Rodack, LLP

(57) ABSTRACT

A method of fabricating a semiconductor device is provided. The method includes providing a die stacking unit that includes a plurality of dies stacked on each other, and a plurality of conductive joints connected between each two adjacent dies. The method includes providing a plurality of dummy micro bumps and dummy pads between the two adjacent dies and between the conductive joints. The dummy micro bumps and the dummy pads are connected to one of the two adjacent dies but not to the other, and the dummy micro bumps are formed on some of the dummy pads but not on all of the dummy pads. The method includes dispensing an underfill material into gaps between the plurality of dies, the conductive joints, the dummy micro bumps, and the dummy pads.

20 Claims, 11 Drawing Sheets

Related U.S. Application Data division of application No. 16/177,576, filed on Nov. 1, 2018, now Pat. No. 11,101,145.

(60) Provisional application No. 62/718,542, filed on Aug. 14, 2018.

(51) Int. Cl.

| | |
|---|---|
| ***H10W 72/00*** | (2026.01) |
| ***H10W 72/20*** | (2026.01) |
| ***H10W 72/90*** | (2026.01) |
| ***H10W 74/15*** | (2026.01) |
| ***H10W 90/00*** | (2026.01) |

(52) U.S. Cl.

CPC ......... *H10W 72/20* (2026.01); *H10W 72/851* (2026.01); *H10W 72/90* (2026.01); *H10W 74/15* (2026.01); *H10W 90/00* (2026.01)

(56) References Cited

U.S. PATENT DOCUMENTS

| | | | | |
|---|---|---|---|---|
| 9,543,276 | B2 * | 1/2017 | Jee | H10W 74/01 |
| 9,721,926 | B2 * | 8/2017 | Choe | H10W 20/20 |
| 11,101,145 | B2 * | 8/2021 | Tsai | H10W 74/012 |
| 2002/0056899 | A1 | 5/2002 | Hikita | |
| 2013/0221493 | A1 | 8/2013 | Kim | |
| 2013/0256872 | A1 | 10/2013 | Su | |
| 2016/0056101 | A1 * | 2/2016 | Jee | H10W 74/01<br>257/737 |
| 2016/0064357 | A1 * | 3/2016 | Choe | H10W 20/20<br>438/109 |
| 2017/0179062 | A1 | 6/2017 | Jang | |
| 2017/0330862 | A1 * | 11/2017 | Choe | H10W 20/20 |

* cited by examiner

METHOD OF FABRICATING SEMICONDUCTOR DEVICE HAVING DUMMY MICRO BUMPS BETWEEN STACKING DIES

PRIORITY CLAIM AND CROSS-REFERENCE

The present application is a Continuation of U.S. application Ser. No. 17/407,367, filed on Aug. 20, 2021 (now U.S. Pat. No. 12,020,952), which is a Divisional of U.S. application Ser. No. 16/177,576, filed on Nov. 1, 2018 (now U.S. Pat. No. 11,101,145), which claims priority of U.S. Provisional Patent Application No. 62/718,542, filed on Aug. 14, 2018, the entirety of which is incorporated by reference herein.

BACKGROUND

Since the invention of the integrated circuit (IC), the semiconductor industry has experienced continued rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvements in lithography have resulted in considerable improvements in 2D IC formation, there are physical limits to the density that can be achieved in two dimensions. One of these limits is the minimum size needed to make these components. Also, when more devices are put into one chip, more complex designs are required.

In an attempt to further increase circuit density, three-dimensional (3D) ICs have been investigated. In a typical formation process of a 3D IC, two dies are stacked on each other and bonded (i.e. electrically coupled) together via electrical connections, such as solder bumps. Then, the bottom die is electrically coupled to a base substrate or packaging substrate via solder bumps, for example. Although existing 3D ICS and 3D packaging methods have been generally adequate for their intended purposes, they have not been entirely satisfactory in all respects.

BRIEF DESCRIPTION OF THE DRAWINGS

For a more complete understanding of the present disclosure, and the advantages of the present disclosure, reference is now made to the following descriptions taken in conjunction with the accompanying drawings, in which.

DETAILED DESCRIPTION

Figure 1:
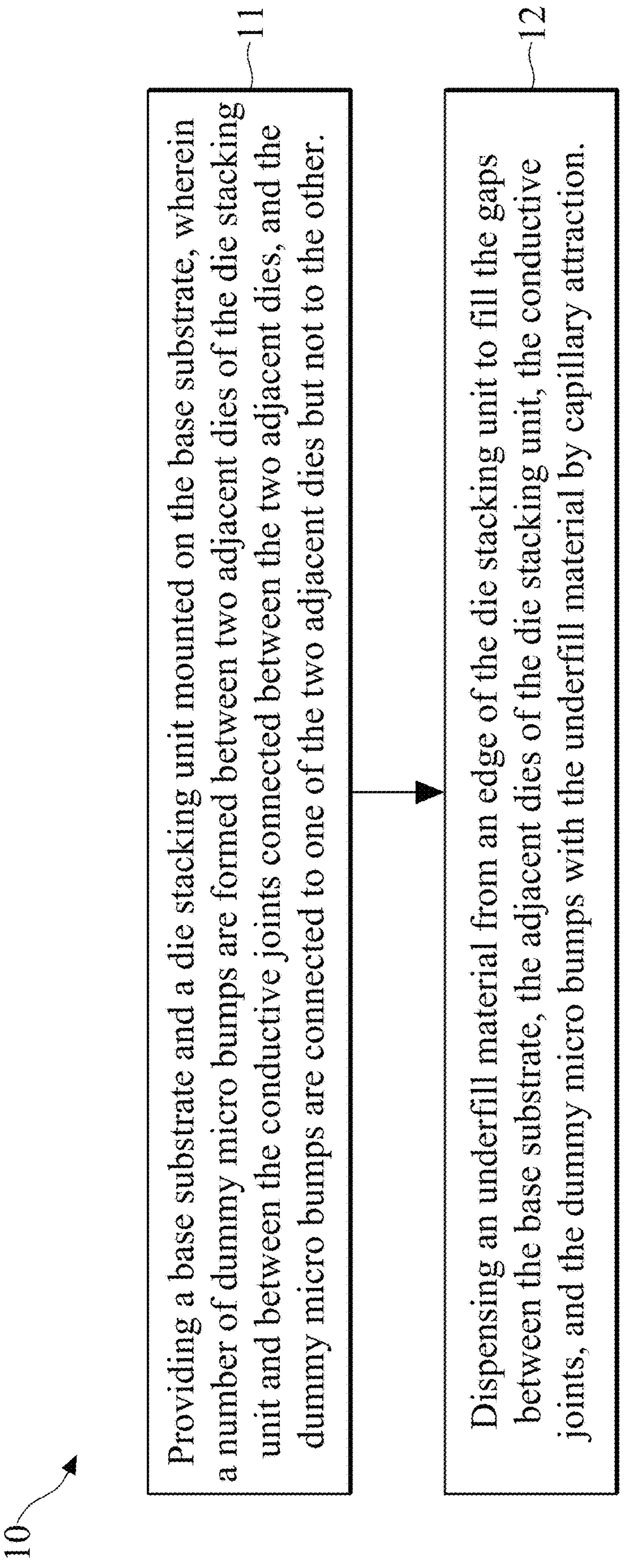
FIG. 1 is a simplified flowchart of a method of fabricating a semiconductor device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Although the terms "first", "second", "third", etc. may be used in the following detailed description to describe various elements, regions or sections, these elements, regions or sections should not be limited by these terms. These terms are only used to distinguish one element, region or section from another element, region or section. Thus, a first element, region or section discussed below could be termed a second element, region or section without departing from the teachings of the present invention.

In addition, the present disclosure may repeat reference numerals and/or letters in the various examples. This repetition is for the purpose of simplicity and clarity and does not in itself dictate a relationship between the various embodiments and/or configurations discussed. Various features may be arbitrarily drawn in different scales for the sake of simplicity and clarity.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the present disclosure provides example embodiments relating to a semiconductor device (such as a three-dimensional (3D) IC) and a method of fabricating the same. The provided semiconductor device includes a number of dummy micro bumps formed between the adjacent stacking dies for improving the flowability of an underfill material filled into the gaps between the adjacent dies. Thus, it can reduce the underfill voids trapped between the adjacent dies, thereby improving the yield and reliability of semiconductor devices. Some variations of the embodiments will be described. Throughout the various views and illustrative embodiments, like reference numbers are used to designate like elements.

Referring to FIG. 1, which is a simplified flowchart of a method 10 of fabricating a semiconductor device, in accordance with some embodiments. For illustration purposes, the flow chart will be described along with the drawings shown in FIGS. 2-4. Some of the described operations can be replaced or eliminated in different embodiments. Alternatively, some operations may be added in different embodiments. The fabrication method 10 includes a number of operations, such as operations 11 and 12 (In the following illustration, well-known features, such as specific semiconductor processes, are not described in detail in order to not unnecessarily obscure embodiments of the present invention).

Figure 2A:
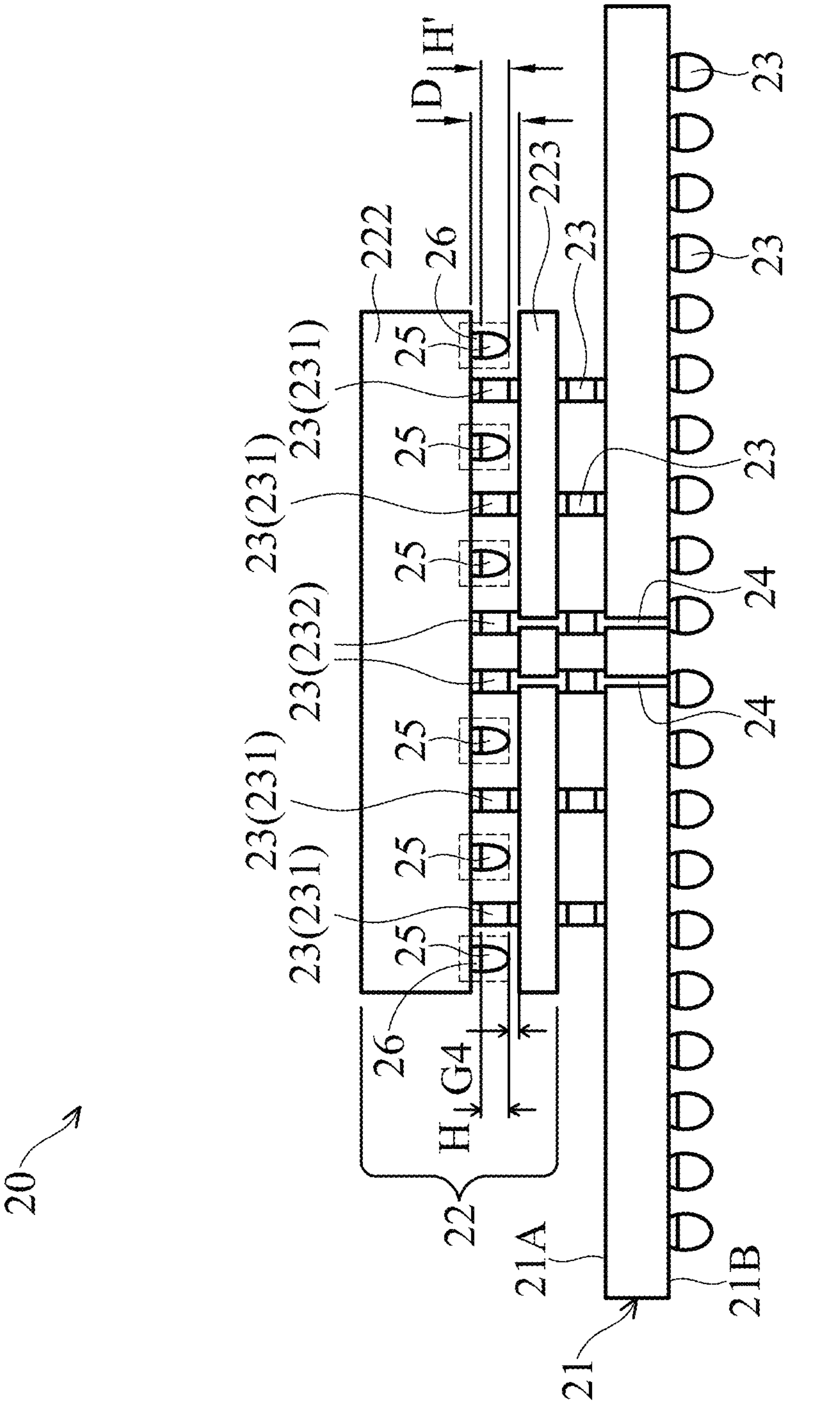
FIG. 2A schematically shows a cross-sectional view of a semiconductor die assembly with a number of dummy micro bumps provided between two adjacent stacking dies, in accordance with some embodiments.

In operation 11, a base substrate 21 and a die stacking unit 22 are provided, and the die stacking unit 22 is mounted on the base substrate 21 to form a semiconductor die assembly 20, as shown in FIG. 2A, which schematically shows a cross-sectional view of a semiconductor die assembly 20 in accordance with some embodiments.

The base substrate 21 is configured to connect the die stacking unit 22 to external electrical components of higher level packaging (not shown). For example, the base substrate 21 can be an interposer or printed circuit board that includes semiconductor components (e.g., doped silicon wafers or gallium arsenide wafers), non-conductive components (e.g., various ceramic substrates, such as aluminum oxide ($Al_2O_3$), aluminum nitride (AlN), etc.), and/or conductive portions (e.g., interconnecting circuitry, through-silicon vias (TSVs), etc.). In the embodiments illustrated in FIG. 2A, the base substrate 21 is electrically coupled to a bottom die 223 of the die stacking unit 22 at the upper side 21A of the base substrate 21 via a number of conductive joints 23 and to external circuitry (not shown) at the lower side 21B of the base substrate 21 via a number of conductive joints 23.

The conductive joints 23 can be solder balls, conductive bumps, and/or other suitable electrically conductive elements. In some embodiments, the conductive bumps are copper bumps or other metal bumps formed of gold, silver, nickel, tungsten, aluminum, the like, or a combination thereof and may each include a solder bump structure over a metal pillar and a barrier layer. On the upper side 21A and lower side 21B, the base substrate 21 has a number of electrical mounts (without reference numerals depicted in the drawings), which may for example, be contact pads, lands, or the like, corresponding to the conductive joints 23, for providing electrical connectivity to the circuit (not shown) within the base substrate 21. In various embodiments, the base substrate 21 can be made from a material with a relatively high thermal conductivity to enhance heat dissipation at the bottom side of the die stacking unit 22.

The die stacking unit 22 includes a number of dies stacked on each other. In some embodiments, the die stacking unit 22 can include two or more dies stacked on each other. For example, the die stacking unit 22 includes a first die 222 (e.g. a top die) at the top layer of the die stacking unit 22, and a second die 223 (e.g., a bottom die) at the bottom layer of the die stacking unit 22 for connecting the die stacking unit 22 to the base substrate 21 as described above, as shown in FIG. 2A. However, the die stacking unit 22 may further include one or more intermediate dies disposed between and parallel to the top die 222 and the bottom die 223 in some other embodiments. The die-to-die spacing D between adjacent dies of the die stacking unit 22 may be approximately 15 microns (μm) or larger (e.g., about 15-50 microns).

The dies of the die stacking unit 22 may be any suitable dies for a particular application. For example, the dies can include various types of semiconductor components and functional features, such as dynamic random-access memory (DRAM), static random-access memory (SRAM), flash memory, other forms of integrated circuit memory, processing circuits, imaging components, and/or other semiconductor features. In various embodiments, the dies of the die stacking unit 22 can be the same type or different types of dies, and the dies may be any suitable size and shape, according to actual needs.

As shown in FIG. 2A, the dies of the die stacking unit 22 are electrically coupled together via a number of conductive joints 23 disposed between adjacent dies. The conductive joints 23 connected between each two adjacent dies may be similar to the conductive joints 23 discussed above and the description will not be repeated herein. In some embodiments, the height H of each of the conductive joints 23 is between about 15 microns and about 45 microns, and the size W (e.g., diameter or width (see FIG. 2B)) of each of the (circular) conductive joints 23 is between about 18 microns and about 60 microns. The conductive joints 23 are formed on a number of electrical mounts, such as contact pads (without reference numerals depicted in the drawings), that are exposed to one side or both sides of each die.

As further shown in FIG. 2A, the individual dies of the die stacking unit 22 can each include a number of TSVs 24 aligned on one or both sides with corresponding conductive joints 23 to provide electrical connections at opposing sides of the dies. Each TSV 24 can include an electrically conductive material (e.g., copper) that passes completely through the individual dies and an electrically insulative material surrounding the electrically conductive material to electrically isolate the TSV 24 from the remainder of the individual dies. Moreover, TSVs 24 are also formed in the base substrate 21 to provide electrical connections at opposing sides of the base substrate 21.

Figure 2B:
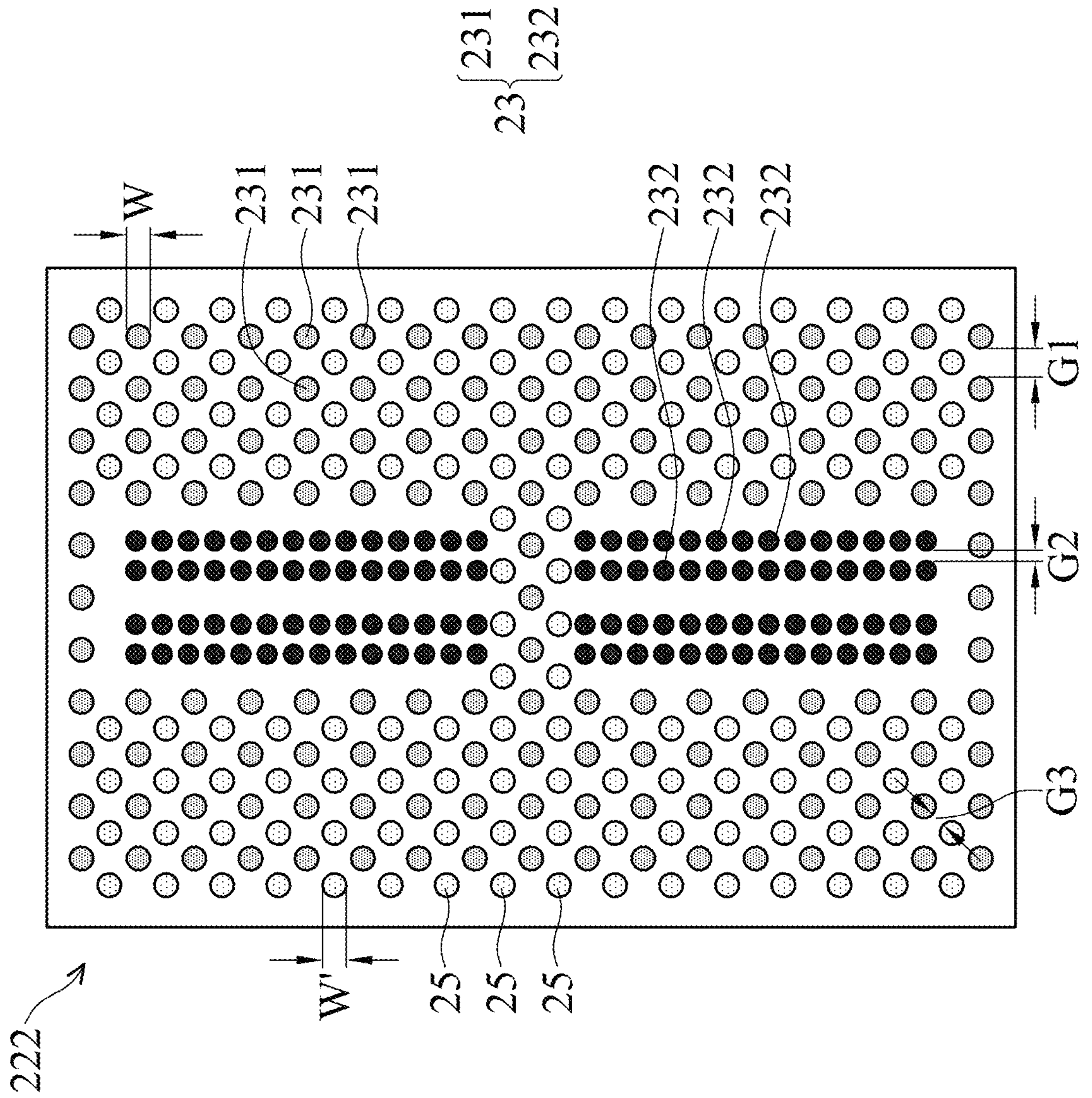
FIG. 2B schematically shows a plan view illustrating the arrangement of the dummy micro bumps and conductive joints on one die of the die stacking unit in FIG. 2A, in accordance with some embodiments.

FIG. 2B schematically shows a plan view illustrating the arrangement of the conductive joints 23 and dummy micro bumps 25 (which will be illustrated in the following paragraphs) on one die (e.g., the top die 222) of the die stacking unit 22 in FIG. 2A, in accordance with some embodiments. Although not shown, the conductive joints 23 on the other die or dies of the die stacking unit 22 may have the same or similar arrangement.

In the embodiments illustrated in FIG. 2B, on a side (e.g., the lower side) of the top die 222, the conductive joints 23 include a number of (second) conductive joints 232 arranged in a central region of the top die 222 and a number of (first) conductive joints 231 arranged in a peripheral region of the top die 222 surrounding the central region. It should be understood that the second conductive joints 232 can be electrically connected to the TSVs 24 in the individual dies for transmitting electrical signal (i.e., the second conductive joints 232 can be signal joints) in the die stacking unit 22, and the first conductive joints 231 can be power joints or ground joints for transmitting power signals to the individual dies, or they can be used to provide support between adjacent dies, for example.

In particular, the second conductive joints 232 are arranged in an array in the central region of the top die 222 with each two adjacent second conductive joints 232 have a gap G2 therebetween, and the first conductive joints 231 are arranged in an array in the peripheral region of the top die 222 with each two adjacent first conductive joints 231 have a gap G1 therebetween, wherein the gap G1 can be greater than the gap G2. For example, the gap G1 is about 90 microns, and the gap G2 is between about 35 microns and about 55 microns. It should be understood that the above arrangement of the conductive joints 23 (including the conductive joints 231 and 232) on the respective dies is merely for illustrative purposes to facilitate the description of the features of the following embodiments, and many variations and modifications can be made to the arrangement of the conductive joints 23.

A number of dummy micro bumps 25 (circled by the dotted squares depicted in FIG. 2A) may also be formed or disposed between two adjacent dies of the die stacking unit 22 and between the conductive joints (e.g., the (first) conductive joints 231) connected between the two adjacent dies.

The dummy micro bumps 25 are disposed between the first die 222 (e.g., the top die) at the top layer of the die stacking unit 22 and the second die 223 (e.g., the bottom die) at the lower layer adjacent to the first die 222 of the die stacking unit 22, in the embodiments illustrated in FIGS. 2A and 2B. In particular, the dummy micro bumps 25 can be connected to the first die 222 but not to the adjacent second die 223. In some alternative embodiments, the dummy micro bumps 25 can be connected to the second die 223 but not to the adjacent first die 222. Note that the term "dummy micro bumps" used in the present disclosure means that they are not like the conductive joints 23 which are electrically coupled to the adjacent dies for signal transmission therebetween (as discussed above). Instead, the dummy micro bumps 25, which are connected to one of the two adjacent stacking dies but not to the other, are configured to improve the flowability of an underfill material that is filled into the gaps between the adjacent dies later (this feature will be illustrated in more detail in the following paragraphs).

In addition, the dummy micro bumps 25 are formed on a number of dummy pads 26 disposed on the top die 222, in the embodiments illustrated in FIG. 2A. The dummy pads 26 can be or cannot be electrically coupled to the circuit (not shown) within the top die 222. In some embodiments, the dummy pads 26 and the electrical mounts (such as contact pads) underneath the conductive joints 23 discussed above can be formed in the same process (e.g., the electroplating process) and made of the same material (e.g., copper). Also, the dummy micro bumps 25 and the conductive joints 23 can be formed in the same process (e.g., the under bump metallization (UBM) process) and made of the same material (e.g., solder bump materials and/or metal materials).

In some other embodiments, the dummy micro bumps 25 and the conductive joints 23 can be formed in different processes. For example, the dummy micro bumps 25 can be formed by dispensing, printing, plating, etc., before or after the formation of the conductive joints 23. The dummy micro bumps 25 may comprise a different material (including such as metal, polymer, etc.) from the conductive joints 23.

In some embodiments, the height H' (see FIG. 2A) and the size W' (see FIG. 2B) of each of the dummy micro bumps 25 can be the same as those of each of the conductive joints 23. Alternatively, the height H' and the size W' of each of the dummy micro bumps 25 can be different from (e.g., greater or less than) those of each of the conductive joints 23. In addition, each of the dummy micro bumps 25 can be formed in any available shape (in plan view), such as a circle, a rectangle, a square, a line, or the like. In some other embodiments, the dummy micro bumps 25 can also be directly formed on or connected to the die or dies, and the dummy pads 26 can be omitted.

In the embodiments illustrated in FIGS. 2A and 2B, on a side (e.g., the lower side) of the top die 222, the dummy micro bumps 25 and the first conductive joints 231 are alternately arranged (e.g., in a staggered manner) in the peripheral region surrounding the central region where the second conductive joints 232 are distributed. In some alternative embodiments, the dummy micro bumps 25 and the first conductive joints 231 can be arranged in an array in the peripheral region of the top die 222. In some embodiments, the dummy micro bumps 25 can be evenly distributed in the whole peripheral region (see FIG. 2B) or distributed in a relatively central portion P of the peripheral region (see FIG. 6).

With the above configuration, each of the dummy micro bumps 25 and one of the first conductive joints 231 adjacent thereto have a gap G3 therebetween (see FIG. 2B), wherein the gap G3 can be smaller than or equal to the gap G2 between each two adjacent second conductive joints 232. For example, the gap G3 is between about 30 microns and about 55 microns, and the gap G2 is between about 35 microns and about 55 microns, in various embodiments.

Although the dummy micro bumps 25 are disposed between the top die 222 and the adjacent bottom die 223 in the above embodiments, the present disclosure is not limited thereto. Additionally or alternatively, a number of dummy micro bumps 25 can also be disposed between any two adjacent stacking dies of the die stacking unit 22, in some other embodiments. Moreover, the dummy micro bumps 25 and conductive joints 23 formed on the other die or dies of the die stacking unit 22 may have the same or similar arrangement as the above embodiments illustrated in FIGS. 2A-2B.

Figure 3:
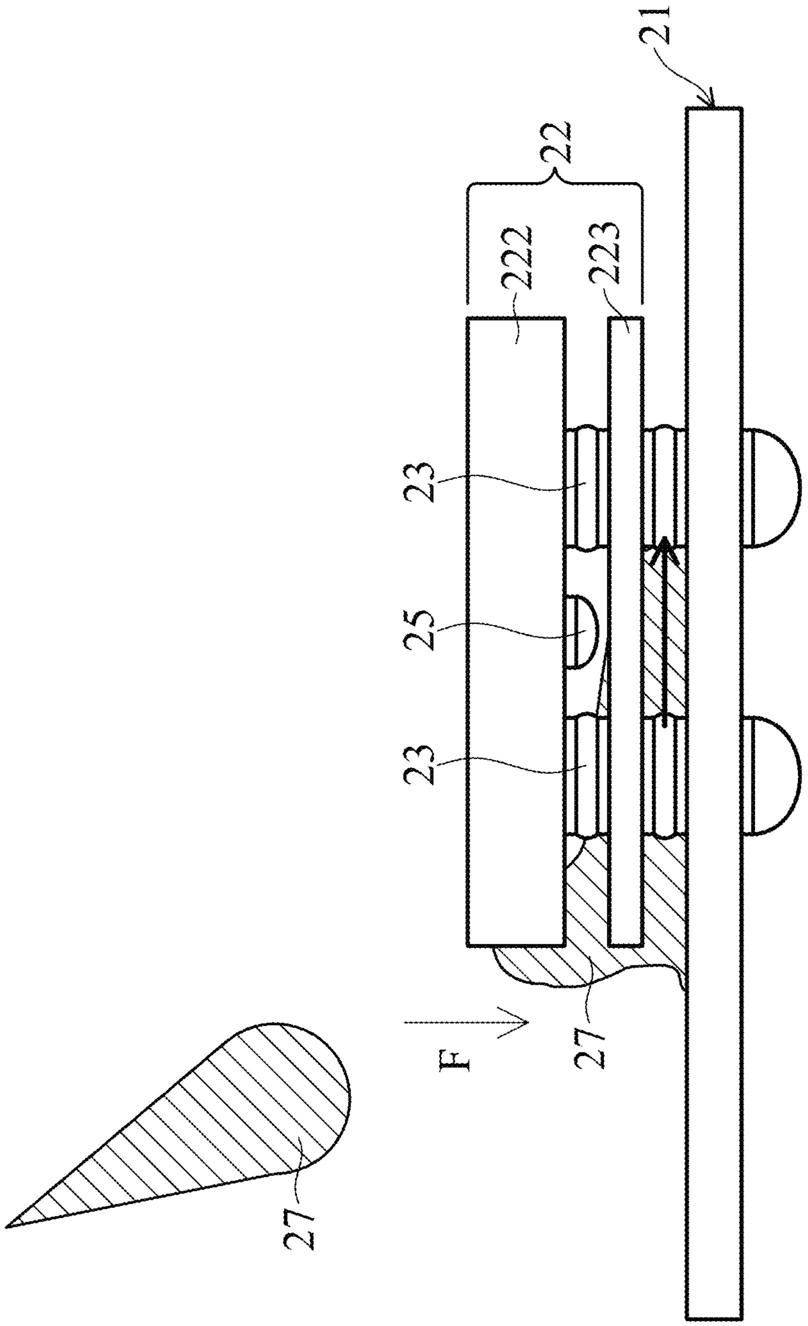
FIG. 3 schematically shows an underfill material dispensed from an edge of the die stacking unit, in accordance with some embodiments.

In operation 12, an underfill material 27 is provided and is dispensed from an edge of the die stacking unit 22, as shown in FIG. 3. Generally, the underfill material 27 is dispensed (the dispensing direction is shown by arrow 271) by a dispenser (not shown) along an edge of the die stacking unit 22 in a dispensing length L (see FIG. 5A). In various embodiments, the dispensing length L is between about 30% and about 70% of the length of the edge of the die stacking unit 22 from which the underfill material 27 is dispensed.

The underfill material 27 may include an insulating material such as an epoxy, a resin, a filler material, a stress release agent (SRA), an adhesion promoter, another material, or a combination thereof. In the course of application, the underfill material 27, which is substantially liquid, can flow along the sides of the stacking dies of the die stacking unit 22, and the underfill material flow can be driven by capillary attraction to fill the gaps between the base substrate 21, adjacent dies of the die stacking unit 22, the conductive joints 23, and the dummy micro bumps 25. The underfill material 27 then can be cured to harden through a chemical reaction, such as in an epoxy or resin. In other embodiments, the underfill material 27 can be an ultraviolet (UV) or thermally cured polymer.

Figure 4:
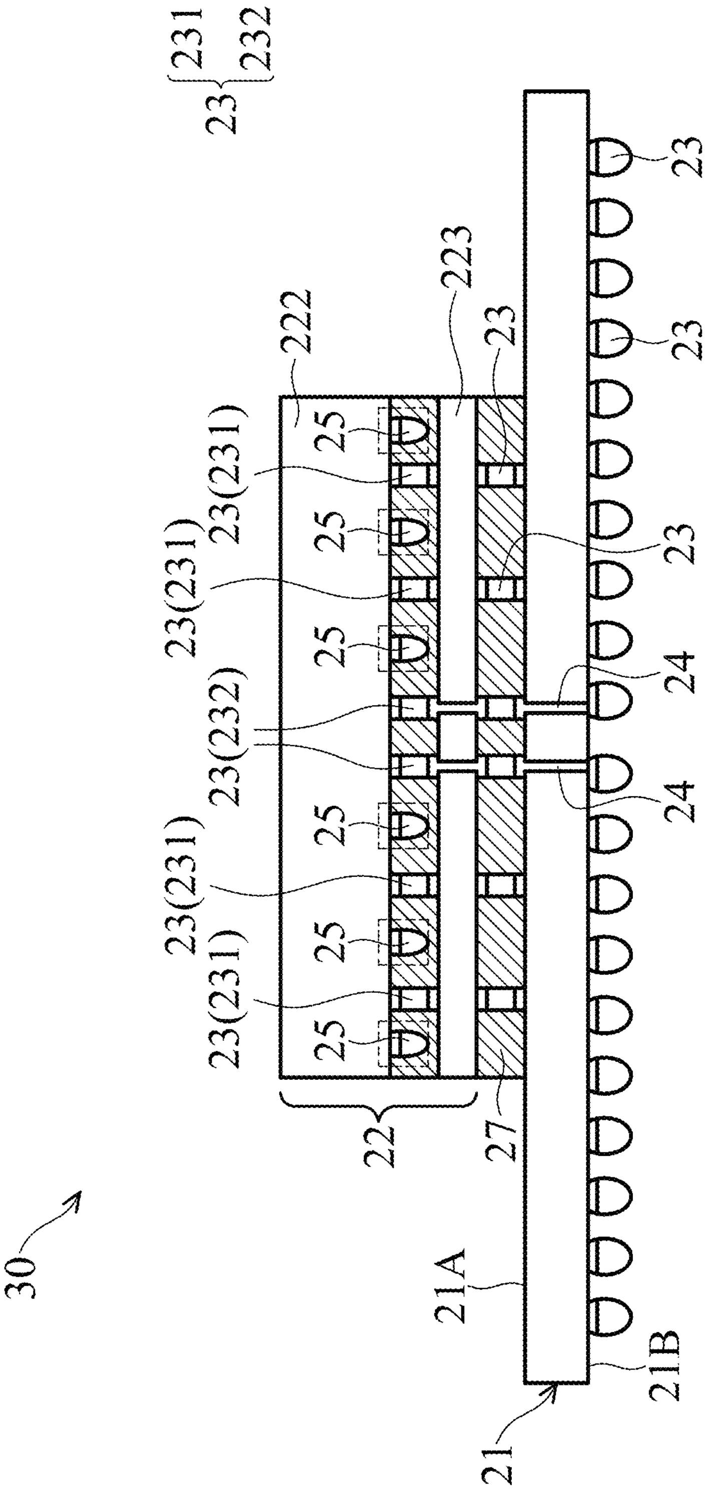
FIG. 4 schematically shows a cross-sectional view of a semiconductor device fabricated by the method in FIG. 1, in accordance with some embodiments.

The underfill material 27 is used to provide a stronger mechanical connection and a heat bridge between the die stacking unit 22 and the base substrate 21, to reduce cracking in the conductive joints 23 caused by thermal expansion mismatches between the adjacent dies and the base substrate 21, and to protect the joints from contaminants, thereby improving reliability of the fabricated semiconductor device 30 (see FIG. 4).

Figure 5A:
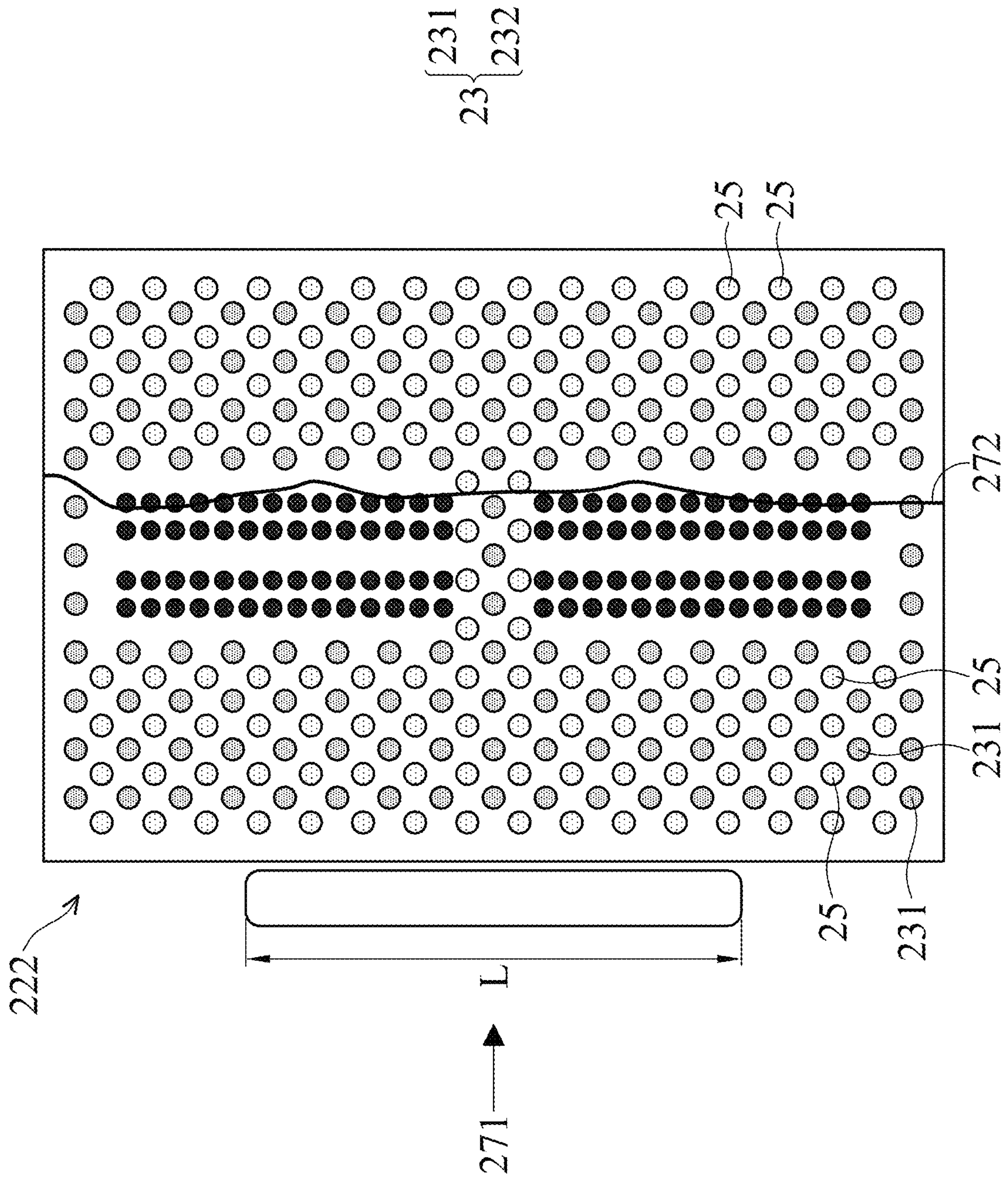
FIG. 5A schematically shows the flow front of the underfill material flow over a side of one die of the die stacking unit having a number of provided dummy micro bumps, during the underfill material dispensing, in accordance with some embodiments.

FIG. 5A schematically shows the flow front 272 of the underfill material flow over a side (e.g., the lower side) of one die (e.g., the top die 222) of the die stacking unit 22 having a number of provided dummy micro bumps 25, during the underfill material dispensing, in accordance with some embodiments. As shown in FIG. 5A, the underfill material flow can flow smoothly or evenly from an edge (e.g., the left edge depicted in FIG. 5A) of the top die 222 to the opposing edge because the size of the gap G3 (see FIG. 2B) between each adjacent first conductive joint 231 and dummy micro bump 25 is the same as or very close to the size of the gap G2 (see FIG. 2B) between each two adjacent second conductive joints 232 (i.e., the capillary attraction generated in the gaps over the entire top die 222 is substantially the same).

Figure 5B:
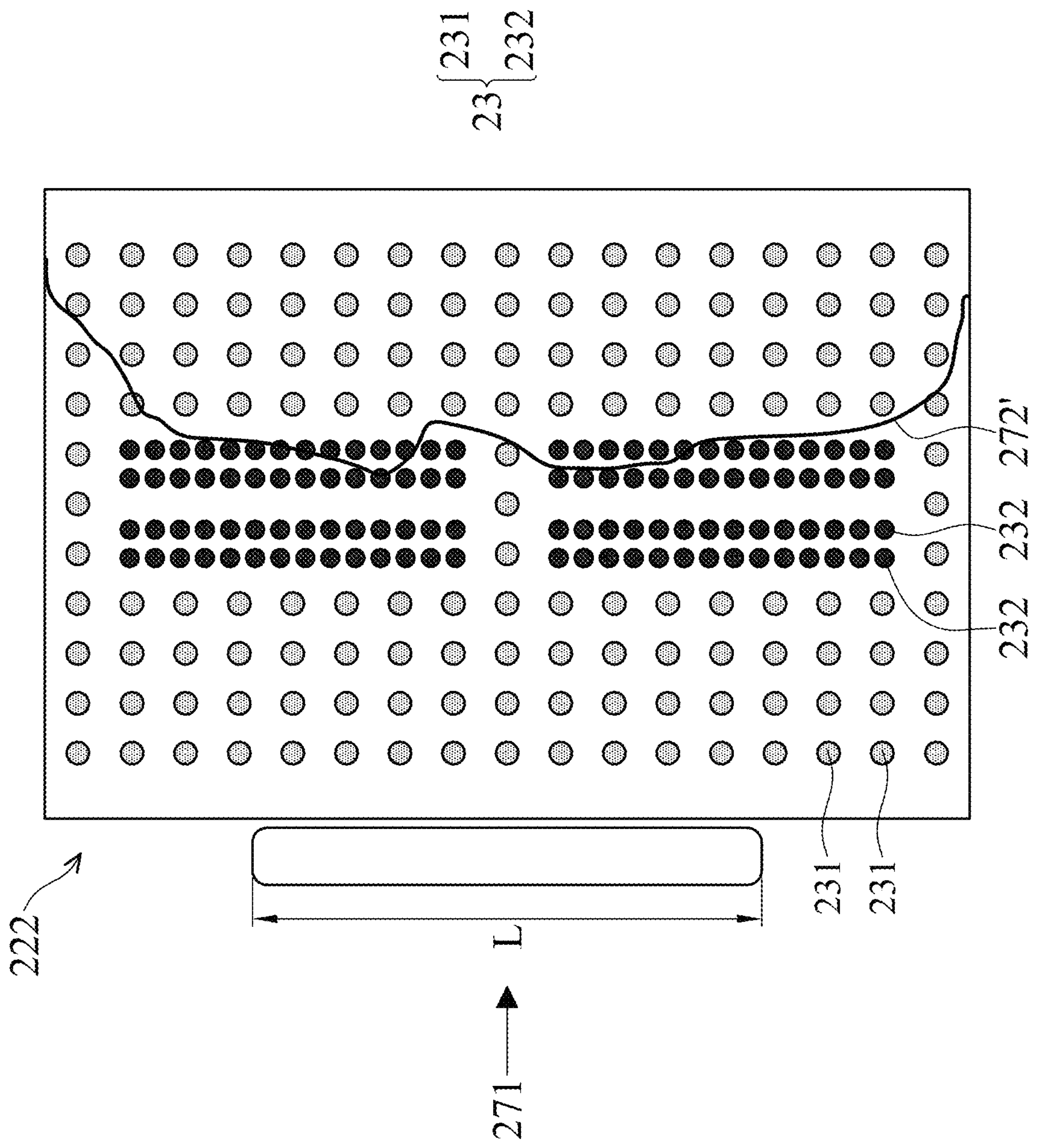
FIG. 5B schematically shows the flow front of the underfill material flow over a side of one die of the die stacking unit without dummy micro bumps, during the underfill material dispensing, in accordance with some embodiments.

As a comparison, FIG. 5B schematically shows the flow front 272' of the underfill material flow over a side (e.g., the lower side) of one die (e.g., the top die 222) of the die stacking unit 22 without dummy micro bumps 25, during the underfill material dispensing, in accordance with some embodiments. As shown in FIG. 5B, because the size of the gap G1 (see FIG. 2B) between each two adjacent first conductive joints 231 formed in the peripheral region is relatively large, causing the capillary attraction generated in the gaps G1 is relatively small and the flow rate of the underfill material flow is relatively slow, and the underfill material flow along the edges (e.g., the upper and lower edges depicted in FIG. 5B) can be generally faster due to edge capillary attraction, the underfill material flow cannot flow smoothly or evenly from an edge (e.g., the left edge depicted in FIG. 5B) of the top die 222 to the opposing edge (note that the flow front 272' can have a concave shape). Thus, the risk of trapped voids formed between the top die 222 and the adjacent lower die 223 (see FIG. 2A) is increased and the reliability of the fabricated semiconductor device is reduced.

In the above embodiments, with a number of the dummy micro bumps 25 provided between adjacent stacking dies of the die stacking unit 22, the flowability of the underfill material 27 filled into the gaps between the adjacent dies can be increased (i.e., the underfill material dispensing window can be enlarged) and the risk of trapped voids formed between the adjacent dies can be reduced. As a result, the reliability of the fabricated semiconductor device (e.g., the device 30 depicted in FIG. 4) is improved. It should be appreciated that the dummy micro bumps 25 not only form a number of finer gaps G3 between the dummy micro bumps 25 and the first conductive joints 231, but also form a number of tiny gaps G4 (see FIG. 2A) between the dummy micro bumps 25 and the adjacent die (e.g., the lower die 233 adjacent to the top die 222), thereby significantly improving the flowability of the underfill material 27 due to enhanced capillary attraction.

Figure 6:
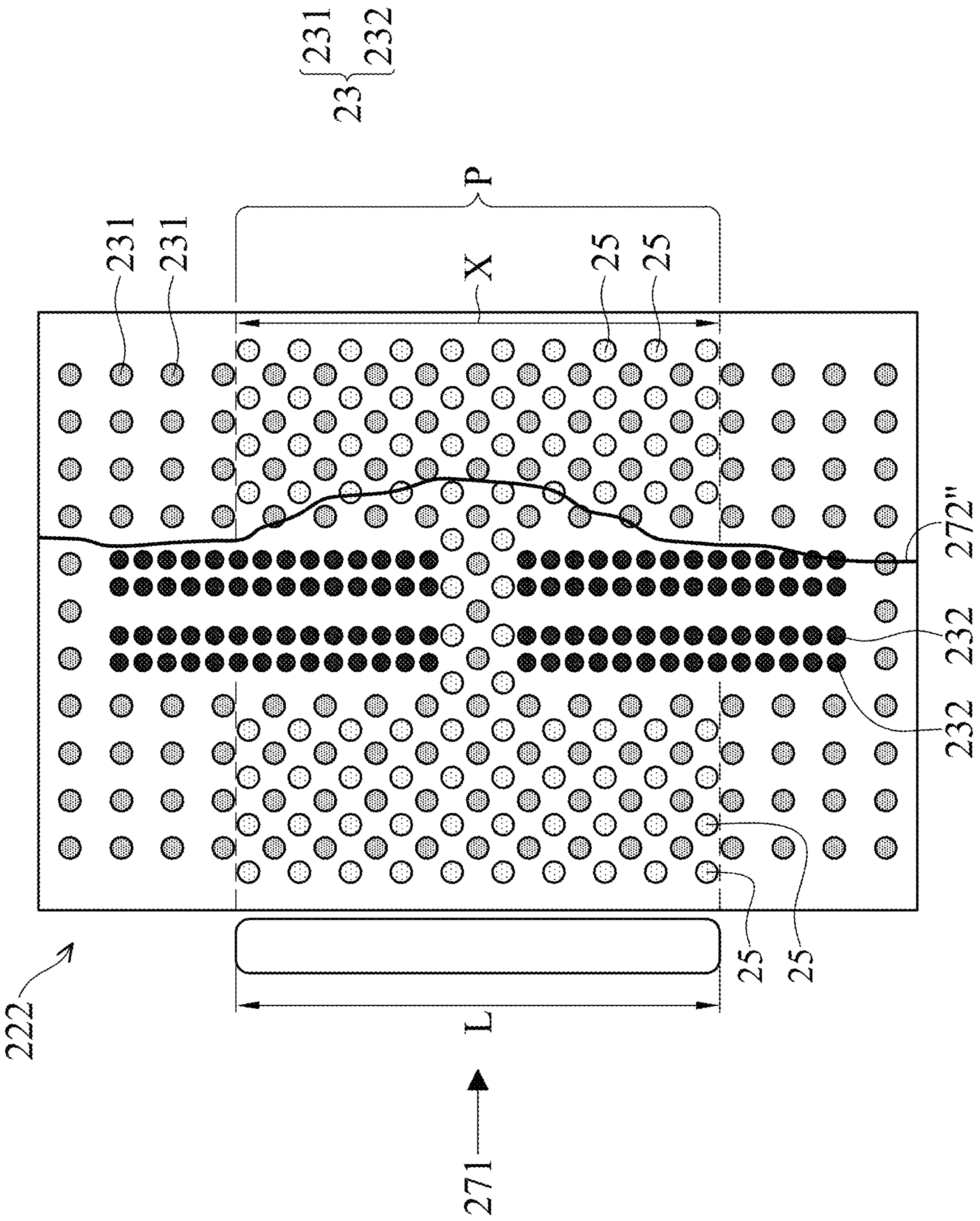
FIG. 6 schematically shows the flow front of the underfill material flow over a side of one die of the die stacking unit having a number of dummy micro bumps distributed in a relatively central portion of the peripheral region of the die, during the underfill material dispensing, in accordance with some embodiments.

FIG. 6 schematically shows the flow front 272" of the underfill material flow over a side (e.g., the lower side) of one die (e.g., the top die 222) of the die stacking unit 22 having a number of dummy micro bumps 25 distributed in a relatively central part P of the peripheral region of the die, during the underfill material dispensing, in accordance with some embodiments. The width X (parallel to the dispensing edge of the underfill material 27) of the part P where the dummy micro bumps 25 are distributed can be equal to or less than the dispensing length L. For example, the width X of the part P is between about 70% and about 100% of the dispensing length L.

With the above configuration, the underfill material flow can flow smoothly from an edge (e.g., the left edge depicted in FIG. 6) of the top die 222 to the opposing edge and the flow front 272' can have a convex shape (i.e., the underfill material flow in the central region (corresponding to the part P) of the top die 222 can be faster than the underfill material flow along the edges). Accordingly, the risk of trapped voids formed between the top die 222 and the adjacent lower die can also be reduced and the reliability of the fabricated semiconductor device is improved.

Referring back to FIG. 3, it should be understood that the applied underfill material 27 tends to flow down lower layers of the die stacking unit 22 due to gravity F, and less underfill material 27 at upper layers of the die stacking unit 22 would increase the risk of trapped void formed. Thus, a number of dummy micro bumps 25 can be disposed between adjacent upper layers (e.g., the upper 2 dies or more) of the die stacking unit 22 to improve the flowability of the underfill material 27 at the upper layers (i.e., to increase the amount of the underfill material 27 at the upper layers), so as to improve the issue of trapped void formed between upper layers of the die stacking unit 22.

In some other embodiments, additionally or alternatively, a number of dummy micro bumps 25 can also be disposed between adjacent lower layers of the die stacking unit 22 and/or between the bottom die of the die stacking unit 22 and the base substrate 21 to improve the flowability of the underfill material 27, thereby reducing manufacturing time.

Figure 7:
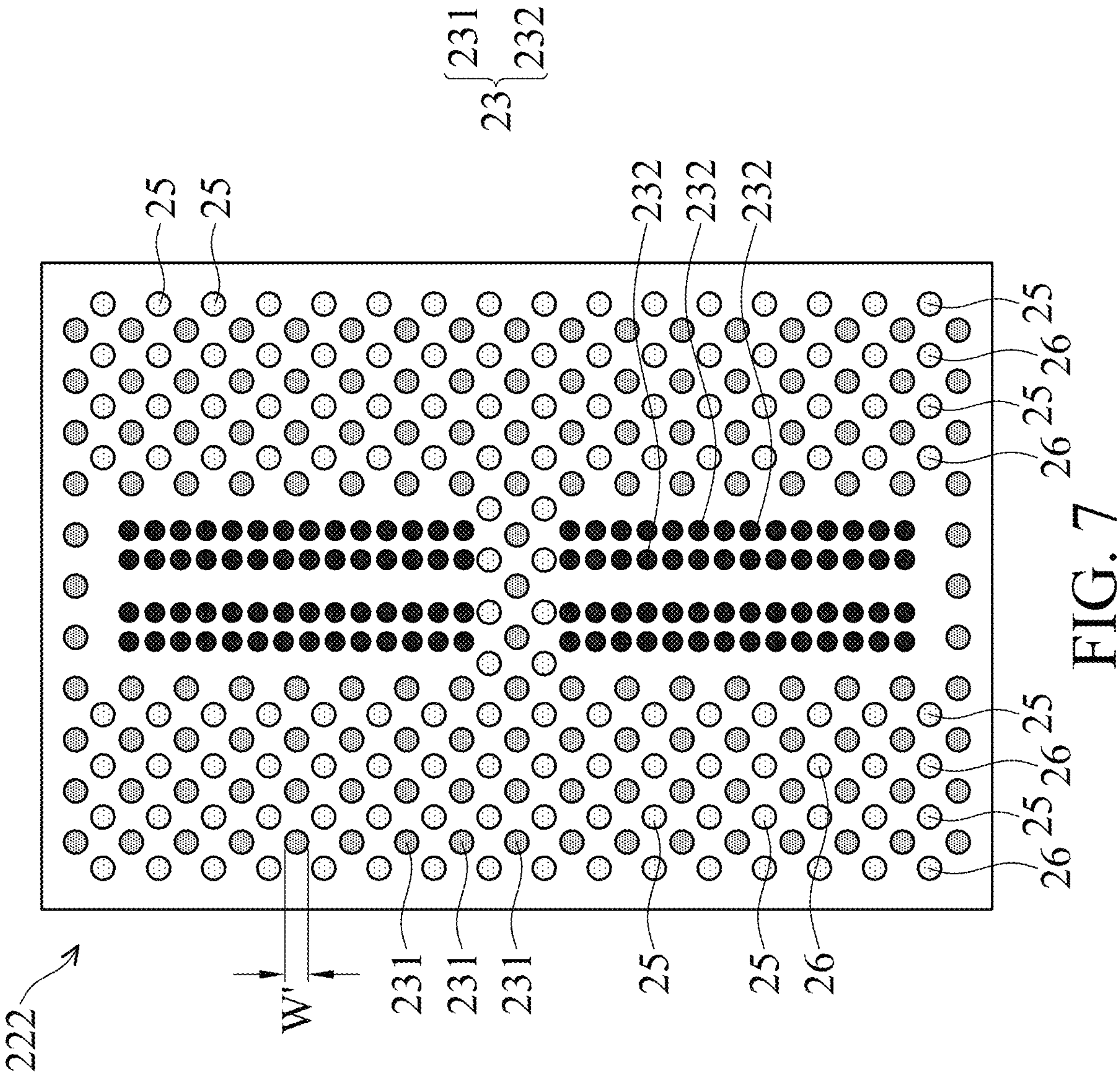
FIG. 7 schematically shows that the positions of the dummy pads and the positions of the dummy micro bumps are not the same, in accordance with some embodiments.

Many variations and modifications can also be made to embodiments of the disclosure. For example, there are a number of dummy micro bumps 25 and a number of dummy pads 26 disposed in the peripheral region of one die (e.g., the top die 222) and between the first conductive joints 231 so as to improve the flowability of the underfill material 27 according to the aforementioned theory. In particular, the positions of the dummy pads 26 and the positions of the dummy micro bumps 25 can be different. For example, in the embodiments depicted in FIG. 7, a number of dummy pads 26 (the same as the dummy pads 26 discussed in FIG. 2A) are evenly distributed in the whole peripheral region of the top die 222, and a number of dummy micro bumps 25 are formed on some of the dummy pads 26 (the dummy pads 26 underneath the dummy micro bumps 25 cannot be seen in FIG. 7) but not on all of the dummy pads 26. The dummy pads 26 are also used to provide finer gaps between adjacent dies to improve the flowability of the underfill material 27.

Figure 8A:
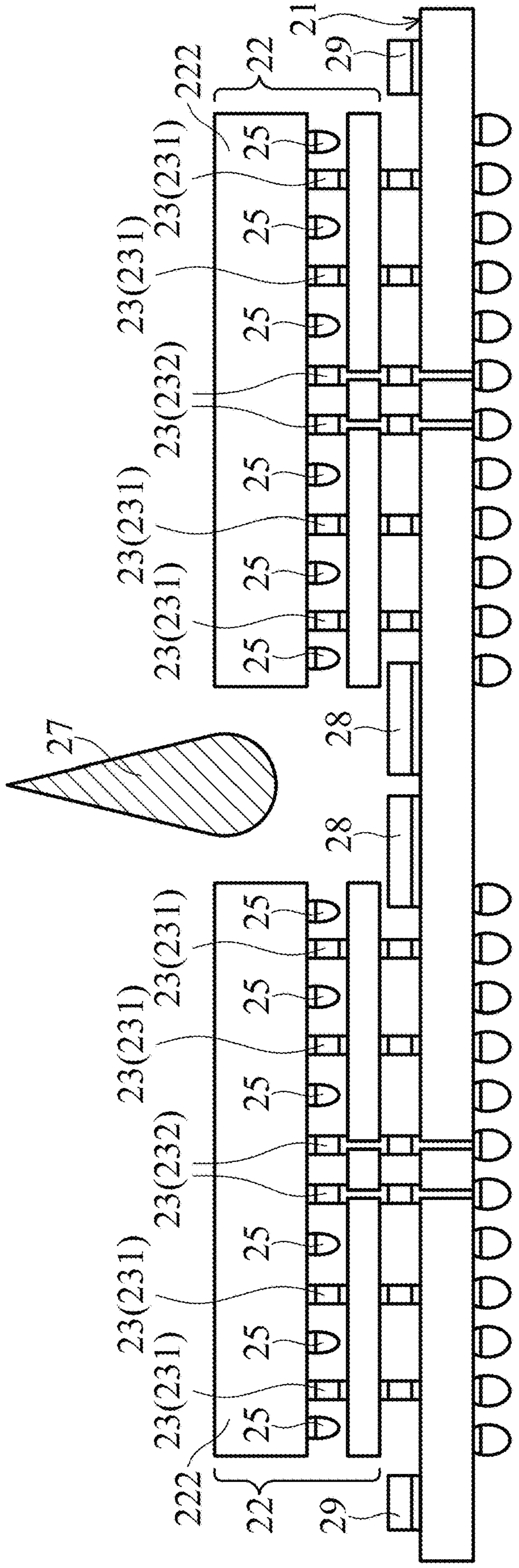
FIG. 8A schematically shows that a number of die stacking units, a number of flow retardant structures, and a number of flow block structures are formed on the base substrate, in accordance with some embodiments.
Figure 8B:
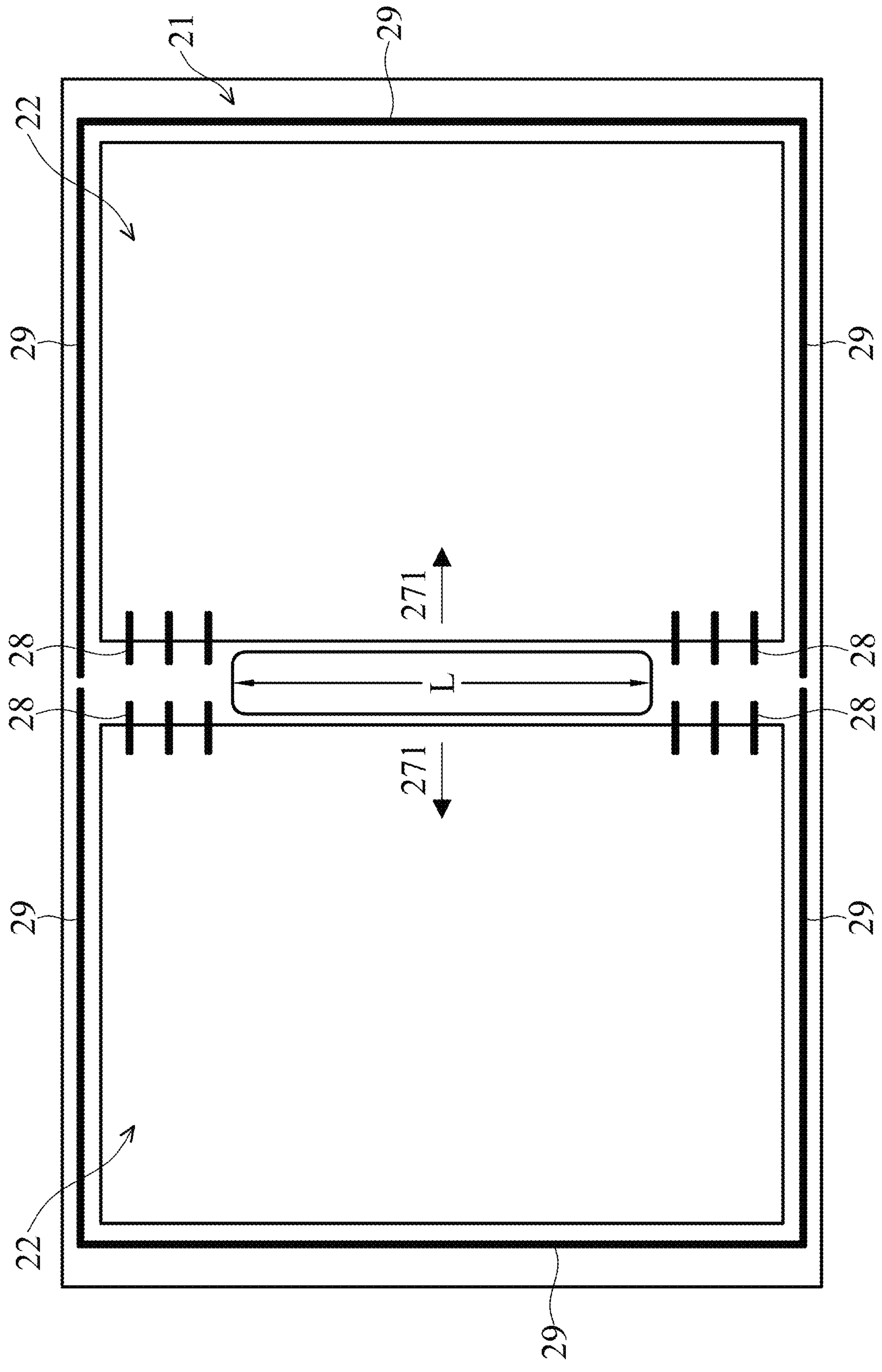
FIG. 8B schematically shows a plan view illustrating the arrangement of the die stacking units, the flow retardant structures, the flow block structures, and the base substrate in FIG. 8A, in accordance with some embodiments.

FIG. 8A schematically shows that a number of die stacking units 22, a number of flow retardant structures 28, and a number of flow block structures 29 are formed on the base substrate 21, in accordance with some embodiments. FIG. 8B schematically shows a plan view illustrating the arrangement of the die stacking units 22, the flow retardant structures 28, the flow block structures 29, and the base substrate 21 in FIG. 8A, in accordance with some embodiments. In the embodiments illustrated in FIGS. 8A and 8B, a number of (e.g. two) die stacking units 22 are mounted on the base substrate 21 and a spacing is formed between the adjacent die stacking units 22. After the formation of the dummy micro bumps 25 between adjacent dies of each die stacking unit 22 is completed, an underfill material 27 is dispensed into the spacing between the adjacent die stacking units 22 and along the adjacent edges of die stacking units 22 in a dispensing length L. As discussed above, the underfill material flow then can be driven (the dispensing direction is shown by arrow 271) by capillary attraction to fill the gaps between the base substrate 21, adjacent dies of the die stacking units 22, the conductive joints 23, and the dummy micro bumps 25.

As further shown in FIGS. 8A and 8B, a number of flow retardant structures 28 are formed on the base substrate 21 in the spacing between the adjacent die stacking units 22. The flow retardant structures 28 can protrude from the base substrate 21 and can be arranged perpendicular to the edge of the die stacking unit 22 from which the underfill material 27 is dispensed. Moreover, the flow retardant structures 28 can extend partially below the die stacking units 22. With the above configuration, the flow retardant structures 28 can reduce the flow rate of the underfill material 27 flowing on the base substrate 21 along the (underfill material dispensing) edge of each die stacking unit 22 and concentrate the underfill material 27 between the die stacking units 22 and the base substrate 21.

As shown in FIGS. 8A and 8B, a number of (elongated) flow block structures 29 can also be formed on (i.e., protruding from) the base substrate 21 to extend along the other edges (in addition to the underfill material dispensing edge) of each die stacking unit 22 in order to limit the spread (or creep) of the underfill material 27 flowing on the base substrate 21. More specifically, the flow block structures 29 are configured to avoid bridging of the underfill material 27 to the adjacent die stacking units 22 (not shown) at the other edges. Accordingly, it can reduce the warpage of the base substrate 21 after curing of the underfill material 27 due to the disconnection of the die stacking units 22 on the base substrate 21. As a result, the reliability of the fabricated semiconductor device is also improved.

The embodiments of the present disclosure have some advantageous features: By forming a number of dummy micro bumps between adjacent dies (of a semiconductor device, such as a 3D IC) to provide finer gaps between the adjacent dies, the flowability of the underfill material can be improved due to better capillary attraction. Therefore, the risk of trapped voids formed between the adjacent dies can be reduced and the reliability of the fabricated semiconductor device is also improved. On the other hand, by forming a number flow retardant structures and flow block structures between adjacent die stacking units on the base substrate, the spread of the underfill material flowing on the base substrate can also be limited, thereby avoid bridging of the underfill material between the adjacent die stacking units. As a result, the reliability of the fabricated semiconductor device is further improved.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In some embodiments, a method of fabricating a semiconductor device is provided. The method includes providing a die stacking unit that includes a plurality of dies stacked on each other, and a plurality of conductive joints connected between each two adjacent dies. The method includes providing a plurality of dummy micro bumps and dummy pads between the two adjacent dies and between the conductive joints. The dummy micro bumps and the dummy pads are connected to one of the two adjacent dies but not to the other, and the dummy micro bumps are formed on some of the dummy pads but not on all of the dummy pads. The method includes dispensing an underfill material into gaps between the plurality of dies, the conductive joints, the dummy micro bumps, and the dummy pads.

In some embodiments, a method of fabricating a semiconductor device is provided. The method includes providing a die stacking unit that includes a first die and a second die stacked on each other, a plurality of first conductive joints, and a plurality of second conductive joints. The first conductive joints and the second conductive joints are connected between the first die and the second die. The second conductive joints are arranged in a central region of the first die with each two adjacent second conductive joints having a first gap therebetween, the first conductive joint are arranged in a peripheral region of the first die with each two adjacent first conductive joints having a second gap therebetween, and the second gap is greater than the first gap. The method includes providing a plurality of dummy micro bumps between the first conductive joints in the peripheral region of the first die, wherein the dummy micro bumps are connected to the first die through a plurality of first dummy pads and are not connected to the second die. The method includes providing a plurality of second dummy pads on the first die, wherein the second dummy pads are not connected with the dummy micro bumps. The method includes filling a plurality of gaps between the first die, the second die, the conductive joints, the dummy micro bumps, and the dummy pads with an underfill material by capillary attraction.

In some embodiments, a method of fabricating a semiconductor device is provided. The method includes providing a die stacking unit that includes a plurality of dies stacked on each other, and a plurality of conductive joints connected between each two adjacent dies. The dies of the die stacking unit include a first die at a top layer of the die stacking unit and a second die disposed at a lower layer adjacent to the top layer. The method includes providing a plurality of dummy micro bumps and dummy pads between the first die and the second die. The dummy micro bumps and the dummy pads are connected to the first die but not to the second die, and the dummy micro bumps are formed on some of the dummy pads but not on all of the dummy pads. The method includes dispensing an underfill material from an edge of the die stacking unit to fill a plurality of gaps between the plurality of dies, the conductive joints, the dummy micro bumps, and the dummy pads. The underfill material is dispensed at a dispensing length along the edge of the die stacking unit, and the dummy micro bumps are formed in an area of first die, wherein the width of the area in a lateral direction is equal to or less than the dispensing length in the lateral direction.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of fabricating a semiconductor device, comprising:

providing a die stacking unit comprising a plurality of dies stacked on each other, and a plurality of conductive joints connected between each two adjacent dies;

providing a plurality of dummy micro bumps and a plurality of dummy pads between the two adjacent dies and between the conductive joints, wherein the dummy micro bumps and the dummy pads are connected to one of the two adjacent dies but not to the other, and the dummy micro bumps are formed on some of the dummy pads but not on all of the dummy pads; and dispensing an underfill material into gaps between the plurality of dies, the conductive joints, the dummy micro bumps, and the dummy pads.

2. The method as claimed in claim 1, wherein the dummy micro bumps and the conductive joints are formed in a same process and made of a same material.

3. The method as claimed in claim 1, wherein the dummy micro bumps and the conductive joints are formed in different processes and/or made of different materials.

4. The method as claimed in claim 1, wherein a height of each of the dummy micro bumps is different from a height of each of the conductive joints.

5. The method as claimed in claim 1, wherein the underfill material is dispensed at a dispensing length along an edge of the die stacking unit, and the dummy micro bumps are formed in an area of the one of the two adjacent dies, wherein a width of the area in a lateral direction is equal to or less than the dispensing length in the lateral direction.

6. The method as claimed in claim 1, wherein the dummy micro bumps and the conductive joints are alternately arranged.

7. The method as claimed in claim 1, wherein the dummy micro bumps and the conductive joints are arranged in an array.

8. A method of fabricating a semiconductor device, comprising:

providing a die stacking unit comprising a first die, a second die, a plurality of first conductive joints, and a plurality of second conductive joints, wherein the first die and the second die are stacked on each other, and the first conductive joints and the second conductive joints are connected between the first die and the second die, wherein the second conductive joints are arranged in a central region of the first die with each two adjacent second conductive joints having a first gap therebetween, the first conductive joint are arranged in a peripheral region of the first die with each two adjacent first conductive joints having a second gap therebetween, and the second gap is greater than the first gap;

providing a plurality of dummy micro bumps between the first conductive joints in the peripheral region of the first die, wherein the dummy micro bumps are connected to the first die through a plurality of first dummy pads and are not connected to the second die;

providing a plurality of second dummy pads on the first die, wherein the second dummy pads are not connected with the dummy micro bumps; and filling a plurality of gaps between the first die, the second die, the conductive joints, the dummy micro bumps, and the dummy pads with an underfill material by capillary attraction.

9. The method as claimed in claim 8, wherein a combined height of one of the dummy micro bumps and one of the first dummy pads is smaller than a distance between the first die and the second die.

10. The method as claimed in claim 8, wherein a height of each of the second dummy pads is smaller than a distance between the first die and the second die.

11. The method as claimed in claim 8, wherein the peripheral region surrounds the central region.

12. The method as claimed in claim 8, wherein each of the dummy micro bumps and one of the first conductive joints adjacent thereto have a third gap therebetween, and the third gap is smaller than or equal to the first gap.

13. The method as claimed in claim 8, wherein the dummy micro bumps are evenly distributed in the whole peripheral region.

14. The method as claimed in claim 8, wherein the dummy micro bumps are distributed in a local portion of the peripheral region.

15. The method as claimed in claim 8, wherein the first dummy pads and the second dummy pads are arranged in the peripheral region.

16. The method as claimed in claim 8, the dummy micro bumps, the first and second dummy pads, and the first and second conductive joints are formed in a same process.

17. The method as claimed in claim 8, the dummy micro bumps comprise a different material from the first and second conductive joints.

18. A method of fabricating a semiconductor device, comprising:

providing a die stacking unit comprising a plurality of dies stacked on each other, and a plurality of conductive joints connected between each two adjacent dies, wherein the dies of the die stacking unit comprise a first die at a top layer of the die stacking unit and a second die disposed at a lower layer adjacent to the top layer;

providing a plurality of dummy micro bumps and a plurality of dummy pads between the first die and the second die, wherein the dummy micro bumps and the dummy pads are connected to the first die but not to the second die, and the dummy micro bumps are formed on some of the dummy pads but not on all of the dummy pads; and dispensing an underfill material from an edge of the die stacking unit to fill a plurality of gaps between the plurality of dies, the conductive joints, the dummy micro bumps, and the dummy pads, wherein the underfill material is dispensed at a dispensing length along the edge of the die stacking unit, and the dummy micro bumps are formed in an area of first die, wherein a width of the area in a lateral direction is equal to or less than the dispensing length in the lateral direction.

19. The method as claimed in claim 18, wherein the conductive joints comprise a plurality of first conductive joints and a plurality of second conductive joints, the second conductive joints are arranged in a central region of the first die with each two adjacent second conductive joints having a first gap therebetween, the first conductive joint are arranged in a peripheral region of the first die with each two adjacent first conductive joints having a second gap therebetween, and the second gap is greater than the first gap, and wherein the dummy micro bumps and the dummy pads are disposed in the peripheral region on opposite sides of the second conductive joints.

20. The method as claimed in claim 18, wherein the dummy micro bumps and the conductive joints are alternately arranged.

* * * * *